(12) United States Patent
Mohn et al.

(10) Patent No.: US 11,018,117 B2
(45) Date of Patent: May 25, 2021

(54) HALF-BRIDGE MODULE WITH COAXIAL ARRANGEMENT OF THE DC TERMINALS

(71) Applicants: ABB Power Grids Switzerland AG, Baden (CH); Audi AG, Ingolstadt (DE)

(72) Inventors: Fabian Mohn, Ennetbaden (CH); Felix Traub, Birmenstorf (CH); Jürgen Schuderer, Zürich (CH)

(73) Assignee: ABB Power Grids Switzerland AG, Baden (CH)

( * ) Notice: Subject to any disclaimer, the term of this patent is extended or adjusted under 35 U.S.C. 154(b) by 0 days.

(21) Appl. No.: 16/673,427

(22) Filed: Nov. 4, 2019

(65) Prior Publication Data

US 2020/0066686 A1 Feb. 27, 2020

Related U.S. Application Data

(63) Continuation of application No. PCT/EP2018/061027, filed on Apr. 30, 2018.

(30) Foreign Application Priority Data

May 2, 2017 (EP) .................................. 17169012

(51) Int. Cl.
*H01L 25/07* (2006.01)
*H01L 23/498* (2006.01)
*H01L 23/538* (2006.01)
*H02M 7/00* (2006.01)
(Continued)

(52) U.S. Cl.
CPC ...... *H01L 25/072* (2013.01); *H01L 23/49811* (2013.01); *H01L 23/5386* (2013.01);
(Continued)

(58) Field of Classification Search
CPC ............. H01L 25/072; H01L 23/49811; H01L 23/5386; H01L 24/48; H01L 24/49;
(Continued)

(56) References Cited

U.S. PATENT DOCUMENTS 5,705,848 A   1/1998  Bayerer
6,212,087 B1  4/2001  Grant et al.
(Continued)

FOREIGN PATENT DOCUMENTS

DE   102014102018 B3   2/2015
DE   102015216083 A1   3/2017
(Continued)

OTHER PUBLICATIONS

European Patent Office, International Search Report & Written Opinion issued in corresponding Application No. PCT/EP2018/061027, dated Jul. 25, 2018, 13 pp.

*Primary Examiner* — Peniel M Gumedzoe
(74) *Attorney, Agent, or Firm* — Slater Matsil, LLP

(57) ABSTRACT

A half-bridge module includes a substrate with a base metallization layer divided into a first DC conducting area, a second DC conducting area and an AC conducting area; at least one first power semiconductor switch chip bonded to the first DC conducting area and electrically interconnected with the AC conducting area; at least one second power semiconductor switch chip bonded to the AC conducting area and electrically interconnected with the second DC conducting area; and a coaxial terminal arrangement including at least one inner DC terminal. The at least first outer DC terminal and the at least one second outer DC terminal protrude from the module and are arranged in a row, such that the at least one inner DC terminal is coaxially arranged between the at least one first outer DC terminal and the at least one second outer DC terminal.

20 Claims, 9 Drawing Sheets

(51) Int. Cl.
*H05K 7/14* (2006.01)
*H01L 23/00* (2006.01)

(52) U.S. Cl.
CPC .............. *H01L 24/48* (2013.01); *H01L 24/49* (2013.01); *H02M 7/003* (2013.01); *H05K 7/1427* (2013.01); *H01L 2224/4846* (2013.01); *H01L 2224/48139* (2013.01); *H01L 2224/48472* (2013.01); *H01L 2224/49111* (2013.01); *H01L 2224/49113* (2013.01); *H01L 2224/49175* (2013.01); *H01L 2924/19107* (2013.01)

(58) Field of Classification Search
CPC ............ H01L 2224/48139; H01L 2224/4846; H01L 2224/48472; H01L 2224/49111; H01L 2224/49113; H01L 2224/49175; H01L 2924/19107; H02M 7/003; H05K 7/1427

See application file for complete search history.

(56) References Cited

U.S. PATENT DOCUMENTS

| | | | |
|---|---|---|---|
| 8,094,475 B2 * | 1/2012 | Friebe | H02M 7/539 363/132 |
| 9,591,755 B2 | 3/2017 | Spang et al. | |
| 2005/0024805 A1 | 2/2005 | Heilbronner et al. | |
| 2009/0085219 A1 | 4/2009 | Bayerer | |
| 2011/0062491 A1 | 3/2011 | Nakata | |
| 2012/0256194 A1 * | 10/2012 | Yoshihara | H01L 24/33 257/77 |

FOREIGN PATENT DOCUMENTS

| | | |
|---|---|---|
| EP | 0527033 A2 | 2/1993 |
| JP | 2005216876 A | 8/2005 |
| WO | 2015176985 A1 | 11/2015 |
| WO | 2016131693 A1 | 8/2016 |

* cited by examiner

HALF-BRIDGE MODULE WITH COAXIAL ARRANGEMENT OF THE DC TERMINALS

FIELD OF THE INVENTION

The invention relates to a half-bridge module.

BACKGROUND OF THE INVENTION

Power semiconductor modules containing solid-state semiconductor switches, such as IGBTs or MOSFETs, are used in various power electronics applications to switch or rectify electric currents. An important and fast growing application are converter systems for electric or hybrid electric vehicles. A typical module for such applications may have a voltage rating of up to 1200 V and a current rating of several hundred amperes.

It is possible that several semiconductor switches are arranged in one power semiconductor module to form a half-bridge and in such a way, a half-bridge module. Such a half-bridge module is usually equipped with terminals for DC+, DC− and AC. These terminals may protrude from a housing of the half-bridge module and may be used to interconnect the module with other electrical devices, such as busbars, DC capacitors, etc.

It is desirable that the commutation loop in the module and the interconnection to the module have low stray inductance, which for example results in short current rise-times and in the possibility of achieving higher switching frequencies.

U.S. Pat. No. 6,212,087 B1 shows a half-bridge module with a low stray inductance.

US 2009/0085219 A1 shows a power semiconductor arrangement with a low inductive connection to and within power semiconductor modules, which low inductive connection is based on parallel conductor plates.

US 2005/0024805 A1 relates to a low inductance circuit arrangement for power semiconductor modules, in which a low-inductive power module assembly using terminal strip-line and ribbon bonds is described.

DE 10 2014 102 018 B3 relates to a power module with a low stray inductance by a special arrangement of wire bonds.

U.S. Pat. No. 5,705,848 relating to a power semiconductor module describes a low-inductive and space-efficient way of interconnecting substrates using floating plates.

DE 10 2015 216 083 A1 shows a power module with a half-bridge, in which the metallization is divided into an AC, two DC− and one DC+ area. The power terminals attached to the DC− and DC+ areas are sandwiched with each other. The DC− power terminals are electrically connected with a metal strip.

JP 2005 216 876 A shows a half-bride arrangement with two separate DC conducting areas on a substrate. The conducting areas are copper patterns and may be electrically interconnected with each other with a wiring material.

DESCRIPTION OF THE INVENTION

It is an objective of the invention to reduce the stray inductance in the interconnections to a half-bridge module. It is a further objective of the invention to provide a half-bridge module with a low inductance terminal arrangement.

These objectives are achieved by the subject-matter of the independent claims. Further exemplary embodiments are evident from the dependent claims and the following description.

A first aspect of the invention relates to a power semiconductor half-bridge module. A semiconductor module may be any device composed of one or more semiconductor chips, their electrical and mechanical interconnections and a housing for these components. The term "power" here and in the following may refer to modules and/or semiconductor chips adapted for processing current of more than 100 V and/or more than 10 A. For example, the power semiconductor module may be used in automotive applications, such as electric vehicles, hybrid vehicles, motorbikes, busses, trucks, off-road construction vehicles and charging stations.

A half-bridge module may be a module housing a half-bridge, i.e. semiconductor chips electrically interconnected in such a way that two semiconductor switches are connected in series providing two DC outputs at the ends of the series connection and an AC output between them.

According to an embodiment of the invention, the half-bridge module comprises a substrate with a base metallization layer divided into a first DC conducting area, a second DC conducting area and an AC conducting area; at least one first power semiconductor switch chip bonded to the first DC conducting area and electrically interconnected with the AC conducting area; and at least one second power semiconductor switch chip bonded to the AC conducting area and electrically interconnected with the second DC conducting area.

The substrate may be a plate of an electrical insulating material, such as plastics or ceramics, which is covered with the base metallization layer on one or both sides. It also may be that the substrate is solely provided by one or more metallization layers. For example, the substrate may be or may comprise a leadframe. The metallization layer may be structured to provide electrical conductors to which the semiconductor chips are connected. For example, the first DC conducting area may be a DC+ conducting area and the second DC conducting area may be a DC− conducting area.

The power semiconductor chips are bonded to their respective conducting area. Bonding may refer to soldering, sintering, and gluing. Furthermore, the power semiconductor chips may be connected with other conducting areas via bond wires. For each power semiconductor chip with a switch, also a power semiconductor chip with a diode may be present, which is also bonded to the respective conducting area and electrically interconnected anti-parallel with the power semiconductor switch chip, for example by bond wires.

The one or more first power semiconductor chips may provide one or more high-side switches for a half-bridge. In the case of more than one first semiconductor chip, these chips may be arranged in first row. The one or more second power semiconductor chips may provide one or more low-side switches for the half-bridge. In the case of more than one second semiconductor chip, these chips may be arranged in second row. Both rows may extend substantially parallel with respect to each other.

Only one row of power semiconductor chips and/or pairs of a power semiconductor switch chip and a power semiconductor diode chip may be used for the high-side and low-side switches, respectively.

According to an embodiment of the invention, the half-bridge module furthermore comprises a coaxial terminal arrangement comprising at least one inner DC terminal, at least one first outer DC terminal and at least one second outer DC terminal, wherein the at least one inner DC terminal, the at least first outer DC terminal and the at least one second outer DC terminal protrude from the module and are arranged in a row, such that the at least one inner DC terminal is coaxially arranged between the at least one first outer DC terminal and the at least one second outer DC terminal. The at least one inner DC terminal is electrically connected to the second DC conducting area. The at least one first outer DC terminal and the at least one second outer DC terminal are electrically connected to the first DC conducting area.

In other words, there may be one or more outer DC terminals that are arranged in sides of one or more inner DC terminals, which may result in a pattern of DC+, DC−, DC+ or vice versa DC−, DC+, DC−. The outer DC terminals may be connected to the DC+ output of the half-bridge or to the DC− output of the half-bridge. Vice versa, the one or more inner DC terminals may be connected to the DC− output of the half-bridge or to the DC+ output of the half-bridge.

The term coaxial in this context may refer to the fact that the DC terminals are arranged in a DC+/DC−/DC+ or DC−/DC+/DC− configuration. The coaxial arrangement may enable a reduced commutation loop stray inductance in the current path provided in the DC terminals and in a busbar, which may be arranged in the same way.

It has to be noted that all the DC terminals may protrude from the module in a common protrusion direction, which may be substantially parallel to the extension direction of the rows of power semiconductor chips. Furthermore, the one or more first outer DC terminals may be arranged besides the first row of power semiconductor chips and/or the one or more second outer DC terminals may be arranged besides the second row of power semiconductor chips.

According to an embodiment of the invention, the first outer DC terminal and the second outer DC terminal are electrically interconnected with an electrically conducting bridging element electrically connected to the first outer DC terminal and the second outer DC terminal and adapted for distributing at least a half of the load current between the first outer DC terminal and the second outer DC terminal.

The first DC conducting area and the one or more first outer DC terminals may be arranged on a first side of the module. The second DC conducting area and the one or more second outer DC terminals may be arranged on a second side of the module. The conducting path from the second DC conducting area to the one or more inner DC terminals may be guided below or above the bridging element between the outer DC terminals, where the inner DC terminals are arranged.

The coaxial DC terminal arrangement may be electrically interconnected with the DC conducting areas such that coaxial DC terminal currents may be guided to a non-coaxial substrate configuration.

At the bridging element, the load current into the first DC conducting area traverses the load current from the second DC conducting area. A two-level or two-layer routing of the load current makes the coaxial DC terminal arrangement compatible with a non-coaxial substrate layout.

It has to be noted that the bridging element has to be able to conduct substantially half of the load current through the one or more outer DC terminals, since only the one or more first outer DC terminals may be directly connected with the first DC conducting area. The one or more second outer DC terminals only may be indirectly connected to the first DC conducting area. In other words, the bridging element may have a conductivity that is substantially the same as the second outer DC terminals.

To provide a two-level routing as described above, several solutions are possible, which enable a crossing of the DC current paths. In general, the two-level current routing may be provided by an elevated section of the one or more inner DC terminals, an additional metal clip, and/or additional substrates with wire bonds.

In particular, the half-bridge module furthermore comprises an insulating substrate with an elevated metallization layer, which insulated substrate is attached to the base metallization layer. The bridging element is provided by the elevated metallization layer on the substrate or the bridging element is a bridging part of the first DC conducting area below the elevated metallization layer.

The term "elevated" may mean that the elevated metallization layer is on a higher level than the base metallization layer. The insulating substrate may be made from ceramics or plastics. The insulating substrate may have metallization layers on both sides and/or may be bonded or glued to the base metallization layer.

According to an embodiment of the invention, the bridging element is arranged inside a housing of the module, in which the substrate and the semiconductor chips are accommodated. It may be that the bridging element is attached to the module and/or electrically connected with the outer DC terminals inside the housing. For example, the bridging element may be a part of the base metallization layer and/or a metallization layer of a further substrate encapsulated into the housing. Also a further conductor like a metal strip may be bonded to the module and after that encapsulated into the housing.

According to an embodiment of the invention, the housing is a mold encapsulation. The mold encapsulation may be generated by transfer molding, for example with a thermoplastic material or with a chemical curing material. The molding material may be an epoxy resin. The mold encapsulation may completely enclose the substrate, the base metallization layer, the power semiconductor chips and/or the bridging element. The DC and AC terminals may protrude from the housing, wherein their part bonded to the module also may be encapsulated by the mold encapsulation.

According to an embodiment of the invention, the power semiconductor switch chips are Si chips. In particular, Si chips, which are usually bigger than SiC chips, may be arranged in two rows of chips as described above and may be connected to a coaxial terminal arrangement. In general, the power semiconductor chips may be based on Si or SiC and/or may provide one or more semiconductor switch elements. Such a switch element may be a transistor, thyristor, IGBT and/or MOSFET. In particular, the semiconductor chips may be Si IGBTs or SiC MOSFETs.

According to an embodiment of the invention, power semiconductor chips providing a freewheeling diode are bonded to the first DC conducting area and the AC conducting area. In the case of IGBTs, freewheeling diodes based on Si also may be provided.

According to an embodiment of the invention, the bridging element is a bridging part of the first DC conducting area, wherein the at least one first outer DC terminal and the at least one second outer DC terminal are bonded to the bridging part. The first DC conducting area may have a first part, which is oriented in the direction of the rows of semiconductor chips and/or the protrusion direction of the DC terminals. A second part of the first DC conducting area may run in a direction orthogonal to this protrusion direction. To this second part or bridging part, the outer DC terminals may be bonded on different sides of the module.

In this case, the current path for the inner DC terminals may have to be guided above the bridging part. This may be done with a further substrate or with bent DC terminals.

According to an embodiment of the invention, the elevated metallization layer is attached on the bridging part and/or is electrically interconnected with the second conducting area.

For example, the second conducting area and the elevated metallization layer may be electrically interconnected with wire bonds and/or ribbons, which may be made of Cu or Al.

According to an embodiment of the invention, the at least one inner DC terminal is bonded to the elevated metallization layer. For example, the inner DC terminals and outer DC terminals may be provided by a leadframe and/or all DC terminals may be bonded to the base and elevated metallization layer in one step.

According to an embodiment of the invention, the at least one first outer DC terminal is bonded to the first DC conducting area. For example, the one or more first outer DC terminals may be bonded to a part of the first DC conducting area in a corner of the base substrate.

According to an embodiment of the invention, the at least one second outer DC terminal is bonded to an auxiliary conducting area of the base metallization layer separated from the first DC conducting area. The auxiliary conducting area may be provided at the other corner of the substrate at the side of the substrate from which the DC terminals protrude. Where the auxiliary conducting area is not at an edge of the substrate, the auxiliary conducting area may be surrounded by the second DC conducting area.

The auxiliary conducting area may be electrically disconnected from the other conducting areas of the base metallization layer on the level of the base metallization layer. However, it may be electrically connected to the first DC conducting area via an elevated structure. For example, this elevated structure may be provided by a further metallization layer on an insulating substrate and/or by a metal clip with an elevated part.

According to an embodiment of the invention, the elevated metallization layer on the insulating substrate is attached above the second DC conducting area, wherein the elevated metallization layer is electrically interconnected with the first DC conducting area and with the auxiliary conducting area. For example, the second conducting area and the elevated metallization layer may be electrically interconnected with wire bonds and/or ribbons, which may be made of Cu or Al.

According to an embodiment of the invention, the at least one inner DC terminal is bonded to a part of the second DC conducting area, which is guided below the bridging element. The second DC conducting area may have a first part, which is arranged on a side of the module opposite to the side of the module, where the first DC conducting area is provided. To this first part, the at least one second semiconductor chip may be directly connected, for example via bond wires. A second part of the second DC conducting area may be guided between the auxiliary conducting area and the part of the first DC conducting area to which the first outer DC terminals are bonded. To and/or above this second part, the insulating substrate may be attached.

According to an embodiment of the invention, the module comprises at least two inner DC terminals. Furthermore, the module may comprise at least two first outer DC terminals and at least two second outer DC terminals. It has to be noted that all DC terminals may be equally designed, for example as metal strips with substantially rectangular cross-section. All DC terminals may protrude from the module in the same direction and/or on the same level.

According to an embodiment of the invention, the DC terminals are made of metal strips. The DC terminal may be made of a leadframe that is bonded to the module.

According to an embodiment of the invention, the DC terminals have the same cross-section. For example, the DC terminal all may have a substantially rectangular cross-section.

According to an embodiment of the invention, the module comprises at least one AC terminal electrically interconnected with the AC conducting area. Also the AC conducting area may be connected with one or more AC terminals, which may be designed equally as the DC terminals, for example as metal strips with substantially rectangular cross-section.

According to an embodiment of the invention, the at least one AC terminal is directly bonded to the AC conducting area. It may be that the bonding part of the one or more AC terminals is enclosed in a housing of the module.

According to an embodiment of the invention, the at least one AC terminal is arranged on an opposite side of the module with respect to the coaxial terminal arrangement. For example, the at least one AC terminal protrudes from the module opposite to a protrusion direction of the DC terminals.

According to an embodiment of the invention, the module comprises at least two AC terminals. Like the DC terminals, more than one AC terminal may be arranged on the same level.

These and other aspects of the invention will be apparent from and elucidated with reference to the embodiments described hereinafter.

Furthermore, there are other possibilities to provide a bridging element for the half-bridge module, as described in the following.

According to an embodiment, the at least one inner DC terminal is bent, such that a connection end of the DC terminal, i.e. an end for connecting external conductors, such as a bulbar, is on the same level as a connection end of the first outer DC terminal and the second outer DC terminal A bonding end of the inner DC terminal, which contrary to the connection end may be inside the mold encapsulation, may be on a higher level than the connection end.

According to an embodiment, the at least one inner DC terminal is guided over the bridging part and bonded to the second conducting area. In this case, no additional substrate is needed. The inner DC terminal may traverse the bridging part on a higher level. The at least one inner DC terminal may be longer than the outer DC terminals.

In general, the one or more inner DC terminals may have a bent structure, running above the first DC conducting area, i.e. the bridging part beneath. This may have the advantage that no additional substrate and wire bonding is needed. Furthermore, good electrical insulation may be already provided by the mold encapsulation material.

For example, the at least one DC terminal is bent, such that a connection end of the at least one inner DC terminal is on the same level as a connection end of the outer DC terminals, a middle section of the at least one first DC terminal is on a higher level above the bridging part and a bonding end is on the same level as the connection end.

According to an embodiment, the bridging element is a bridging metal strip guided above the at least one AC terminal and electrically interconnecting the at least one first outer DC terminal and the at least one second DC terminal. The bridging metal strip may be made of the same material as the DC terminal, such as Cu, and/or may have the same thickness. The bridging metal strip may be bent such that an elevated middle section is on a higher level than its bonding ends. The middle section may cross and/or traverse the inner DC terminals.

According to an embodiment, the bridging metal strip is bonded to the first conducting area and/or the bridging metal strip is bonded to the auxiliary conducting area. The crossing of the DC+ conducting path and the DC− conducting path may be achieved by a metal strip with an elevated middle section bonded to the first conducting area and the auxiliary conducting area. The bonding of the metal strip may be done using the same bonding process as the bonding of the DC terminals, such as ultrasonic welding, laser welding or soldering, but may also be done in a separate process.

According to an embodiment, the bridging metal strip is bonded to the at least one first outer DC terminal and/or the bridging metal strip is bonded to the at least one second outer DC terminal. The crossing of the DC+ current path and the DC− current path may be achieved by a metal strip with an elevated middle section bonded to at least one terminal of the first outer DC terminals and at least one terminal of the second outer DC terminals.

The attachment of such a bridging metal strip may be done after the provision of the mold encapsulation to the parts of the DC terminals sticking out of the mold encapsulation. Alternatively, the bridging metal strip may be bonded to the DC terminals at a position inside the mold encapsulation, before the molding process.

It also may be possible that one end of the bridging metal strip is bonded to a DC terminal and the other end is bonded to a conducting area.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

Figure 1A:
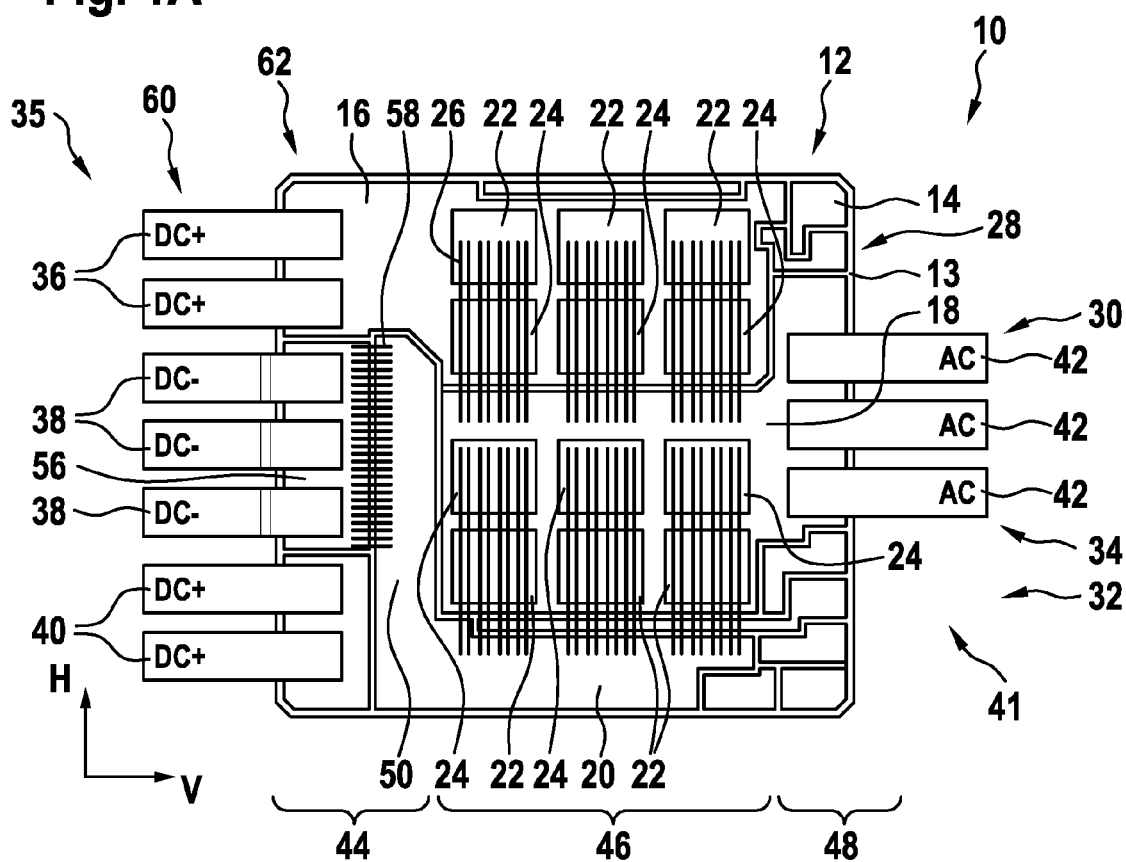
FIG. 1A schematically shows a top view of a half-bridge module according to an embodiment of the invention.

FIG. 1 shows a half-bridge module 10 comprising a substrate 12 with a base metallization layer 14, for example a copper layer. The substrate 12 also may comprise an electrically insulating layer 13, for example made of ceramics.

The metallization layer 14 is separated into a first DC conducting area 16, an AC conducting area 18 and a second DC conducting area 20. Power semiconductor chips 22 providing a switch and power semiconductor chips 24 providing a diode, such as an IGBT, are bonded with their bottom side to the first DC conducting area 16 and to the AC conducting area 18. On the second DC conducting area 20, no chips are provided. The chips 22, 24 on one area 16, 18 are connected on their top sides with each other and with the neighbouring area 18, 20 via bond wires 26.

The semiconductor diode chips 24 and their diodes are electrically connected anti-parallel to the respective semiconductor chips 22 with the switch. Altogether, the chips 22, 24 are electrically connected into a half-bridge, which DC+ side is provided by the first DC conducting area 16, which may be seen as a DC+ conducting area 16 and which DC− side is provided by the second DC conducting area 20, which may be seen as a DC− conducting area 20.

The semiconductor switch chips 22 and the semiconductor diode chips 24 on the DC+ conducting area 16 are arranged in a row 28 of high-side semiconductor switch chips 22 and a row 30 of high-side semiconductor diode chips 24. The semiconductor switch chips 22 and the semiconductor diode chips 24 on the AC conducting area 18 are arranged in a row 32 of low-side semiconductor switch chips 22 and a row 34 of low-side semiconductor diode chips 24.

The module 10 furthermore comprises a coaxial DC terminal arrangement 35 with DC terminals 36, 38, 40 protruding in a direction V from the module 10. A DC terminal arrangement 41 of AC terminals 42 protrudes in the direction V from a side of the module 10. Also, the rows 28, 30, 32, 34 are aligned in the direction V. The DC terminals 36, 38, 40 as well as the AC terminals 42 may be all made of metal strips, for example with the aid of a leadframe. All may have the same thickness, the same widths and/or the same cross-section. It has to be noted that in the following always the plural form for the terminals 36, 38, 40, 42 will be used. However, it is also possible that only one DC terminal 36, 38, 40 and/or one AC terminal is present.

The substrate may be divided into a DC bonding and/or current distribution section 44, a chip bonding and/or middle section 46 and an AC bonding section 48. In the section 44, only the DC conducting areas 16, 20 and optionally areas electrically connected to these areas 16, 18 may be present. In the middle section 48, all three areas 16, 18, 20 may be present and in the section 48, only the AC conducting area 18 may be present. Furthermore, additional conducting areas, such as conducting areas for distributing gate signals and/or sensor signals, may be present in some or all of the sections 44, 46, 48.

The DC terminals 36, 38, 40 are arranged in a row along a direction H, which is orthogonal to the direction V and/or are provided on the side of the DC bonding section 44. Analogously, the AC terminals 42 are arranged in a row along a direction H and/or are provided on the side of the AC bonding section 48.

There are two types of DC terminals, i.e. outer DC terminals 36, 40 and inner DC terminals 38, which are arranged coaxially with respect to each other. The inner DC terminals 38, which are connected to the second DC conducting area 20, may also be seen as DC− terminals 38. The outer DC terminals 36, 40, which are connected to the first DC conducting area 16, may also be seen as DC+ terminals 36, 40.

In the row of DC terminals, the inner DC terminals 38 are arranged between the outer DC terminals 36, 40. The first outer DC terminals 36 are bonded to the first DC conducting area 16 at a first edge of the module 10 and/or are arranged besides the first DC conducting area 16 with respect to the direction V. The second outer DC terminals 40 are bonded to the metallization layer 14 at a second edge and/or are arranged besides the second conducting area 20 with respect to the direction V. As is described below and above, at the second edge, the metallization layer 14 may be part of the first DC conducting area 16 or may provide an auxiliary conducting area electrically interconnected with the first DC conducting area 16.

Between the first and the second edge, the inner DC terminals 38 are bonded to the second DC conducting area 20 or a further conductor electrically interconnected with the second DC conducting area, which may be provided above the metallization layer 14.

In general, in the section 44 of the module 10, the current from the outer DC terminals 36, 40 has to be guided to the first DC conducting area 16 and the current form the inner DC terminals 38 has to be guided to the second DC conducting area 20. The first DC conducting terminals 36 are directly bonded to the first DC conducting area 16. The second DC conducting area 20 has a part 50 in the current distribution section 44, which runs besides the AC conducting area 18 to the middle of the module 10 (seen with respect to the direction H). There, the inner DC terminals 38 are electrically connected with the part 50.

Additionally, the second outer DC terminals 40 have to be electrically connected with the first DC conducting area 16 and thus a current path has to be provided above or below the current path from the inner DC terminal 38 to the part 50.

Figure 1B:
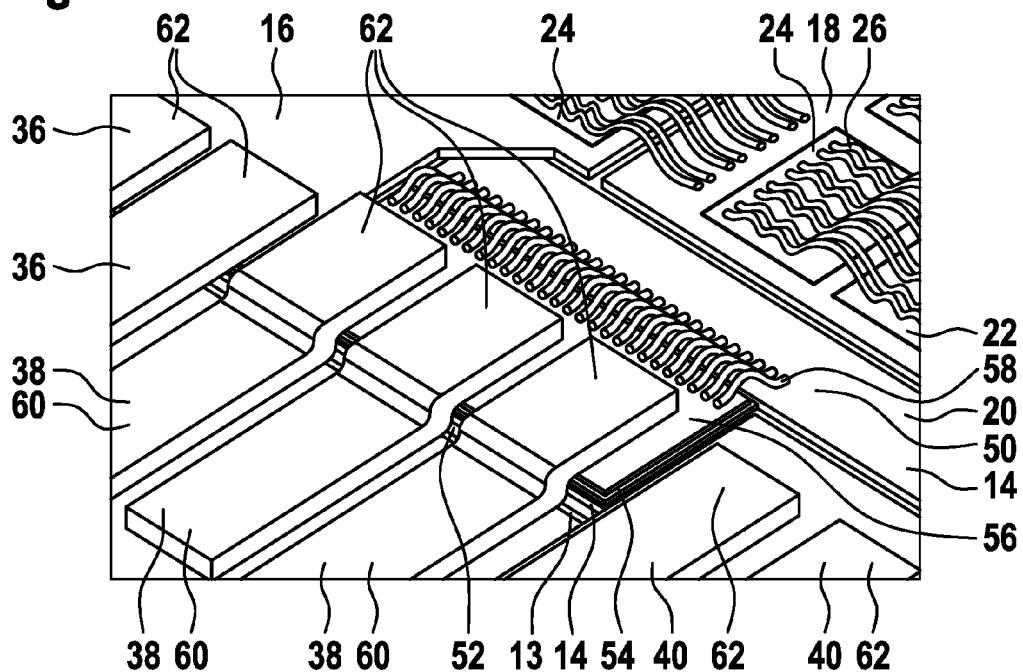
FIG. 1B schematically shows a perspective view of a part of the half-bridge module of FIG. 1A.

As shown in FIGS. 1A and 1B, the first DC conducting area 16 may have a part 52 in the section 44 of the module 10, which is provided between the first edge and the second edge of the substrate 12 and/or which runs along the direction H from the bonding area of the first outer DC terminals 36 to the bonding area of the second outer DC terminals 40. This part 52 electrically interconnects the second outer DC terminals 40 with the first DC conducting area 16 and/or has to be adapted to carry about half of the load current through the outer DC terminals 36, 38.

On the part 50, an insulating substrate 54 with an elevated metallization layer 56 electrically insulated from the part 50 is attached, to which the inner DC terminals 38 are bonded. The metallization layer 56 is connected via wire bonds 58 with the part 50 of the second DC conducting area 20. In such a way, a crossing of the DC+ and DC− current paths is achieved.

The inner DC terminals 38 are bent, such that their connection ends 60 are on the same level as the connection ends 60 of the outer DC terminals 36, 40. The bonding ends 62 of the inner DC terminals may be on a higher level than the bonding ends 62 of the outer DC terminals 62.

Figure 2A:
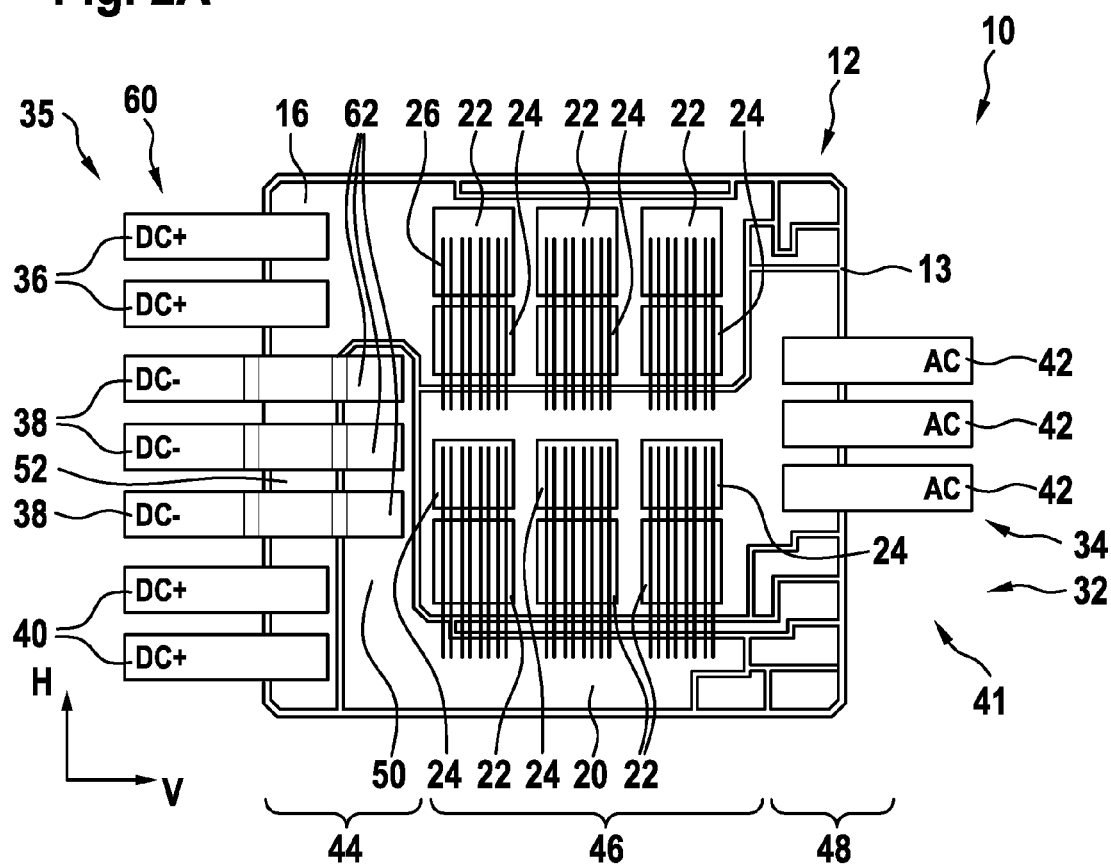
FIG. 2A schematically shows a top view of a half-bridge module according to a further embodiment.
Figure 2B:
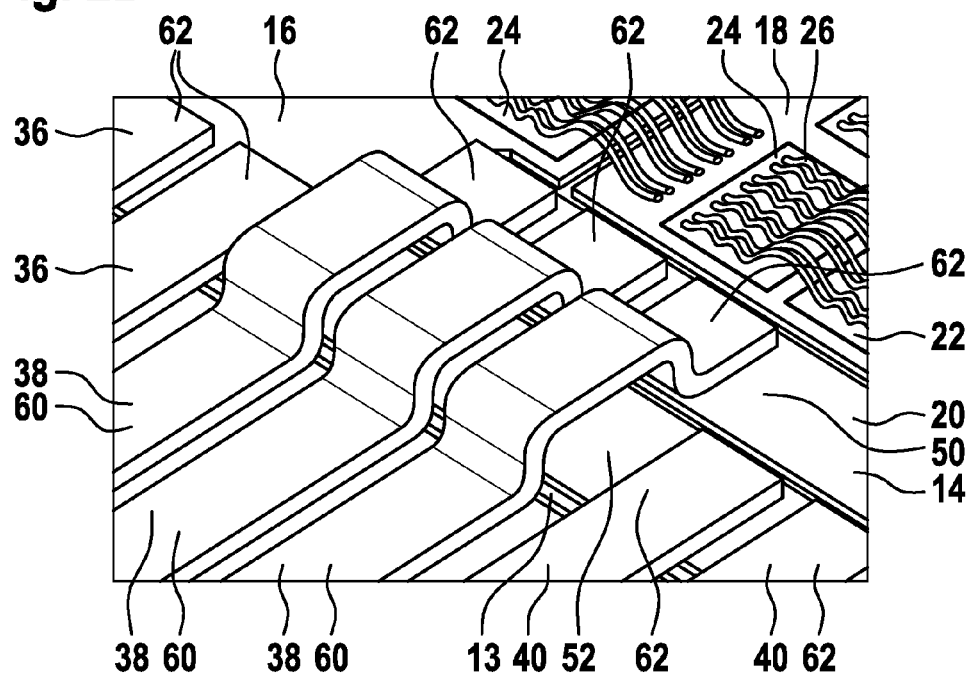
FIG. 2B schematically shows a perspective view of a part of the half-bridge module of FIG. 2A.

The following drawings all show modules 10, which may be designed like the module 10 of FIGS. 1 and 2 but with differently realized crossings of the DC+ and DC− current paths. In the embodiment of FIGS. 2A and 2B, also the part 52 running along the direction H and directly interconnecting the outer DC terminals 36, 38 is present. However, in FIGS. 2A and 2B, the inner DC terminals 38 are directly bonded to the part 50 of the second DC conducting section 20 with their ends 62. In this case, the inner DC terminals 38 are longer as the outer DC terminals 36, 40.

Furthermore, the inner DC terminals 38 are bent, such that a middle section 64 above the part 52 is on a higher level than their ends 60, 62.

Figure 3A:
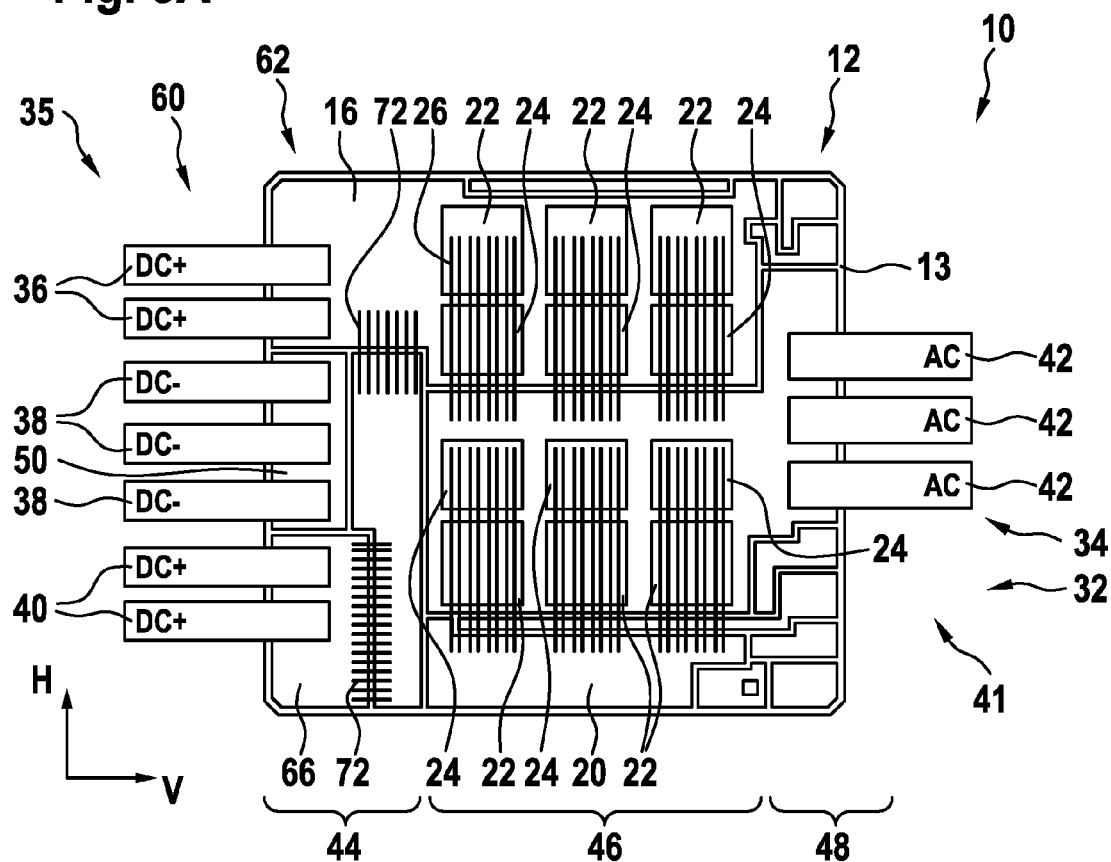
FIG. 3A schematically shows a top view of a half-bridge module according to an embodiment of the invention.
Figure 3B:
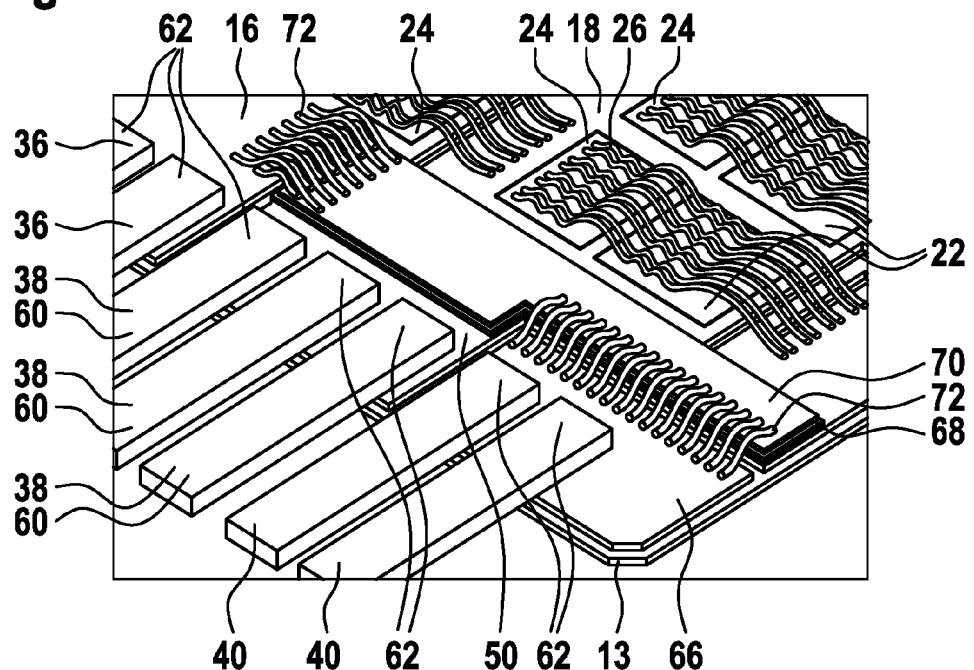
FIG. 3B schematically shows a perspective view of a part of the half-bridge module of FIG. 3A.

In FIGS. 3A and 3B (and also the following drawings), the part 52 of the first DC conducting area 16 is not present. The bonding area of the second outer DC terminals 40 is separated from the areas 16, 20 and is an auxiliary conducting area 66. The metallization layer 14 is designed, such that the part 50 of the second DC conducting area 20 is provided up to the border of the substrate 12. The part 50 encompasses the auxiliary conducting area 66.

In this case, the inner DC terminals 38, which like the DC terminal are bonded to the metallization layer 14, may have the same length and/or form as the outer DC terminals 36, 40.

There are different possibilities, how the auxiliary conducting area 66 may be electrically connected with the first DC conducting area 16.

As shown in FIGS. 3A and 3B, an insulating substrate 68 may be attached to the substrate 12 in the section 44, for example on top of the part 50. The insulating substrate 68 has an elevated metallization layer 70, which is connected via wire bonds 72 with the auxiliary conducting area 66 and with the bonding area of the first outer DC terminals 36 provided by the first DC conducting area 16. The metallization layer 70 as well as the wire bonds 72 have to be adapted to carry about half of the load current through the outer DC terminals 36, 40.

As shown in FIG. 4A to 5C, a metal clip 74 may electrically interconnect the outer DC terminals 36, 40. The metal clip may be aligned along the direction V. The metal clip 74 may be made of the same material as the terminals 36, 38, 40, 42, for example the same leadframe material. It may have the same thickness, width and/or cross-section. The metal clip 74 is bent, such that its bonding ends 76 are on a lower level than a middle section 78, which may run above the base metallization layer 14 and/or the ends 62 of the inner DC terminals 38 and optionally at least some of the outer DC terminals 36, 40.

Figure 4A:
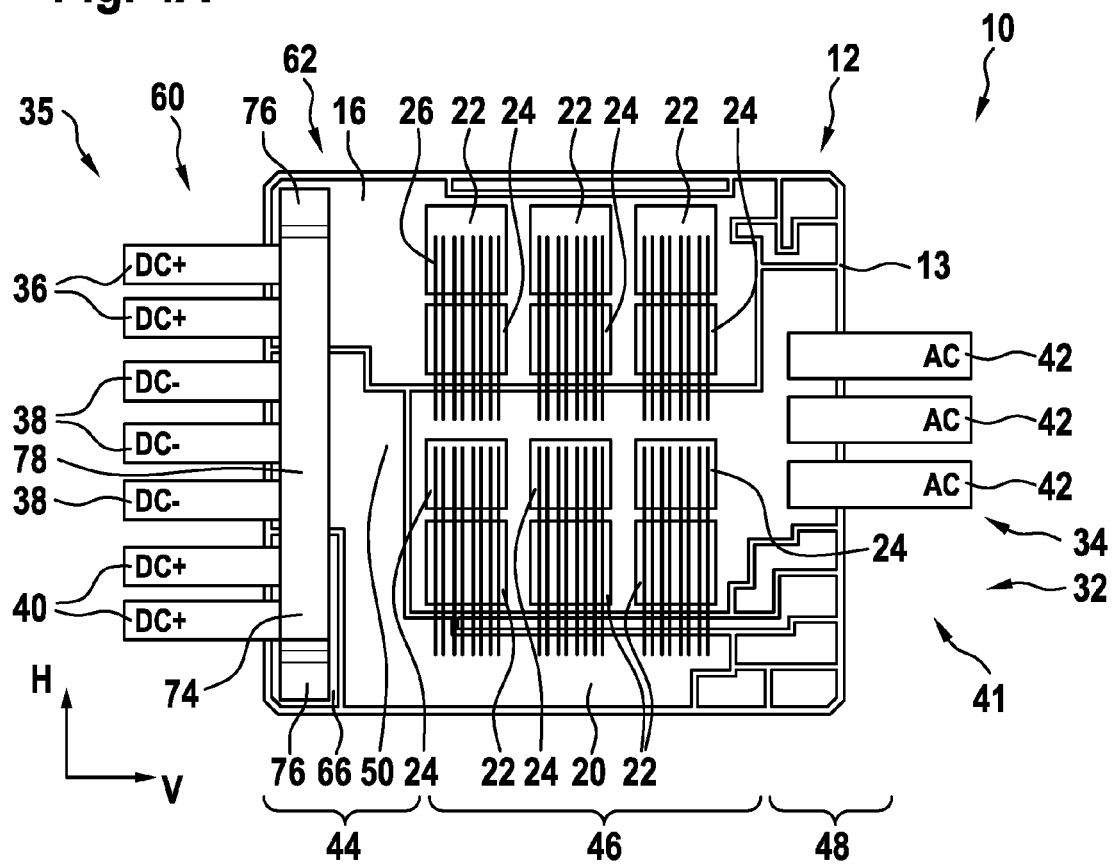
FIG. 4A schematically shows a top view of a half-bridge module according to a further embodiment.
Figure 4B:
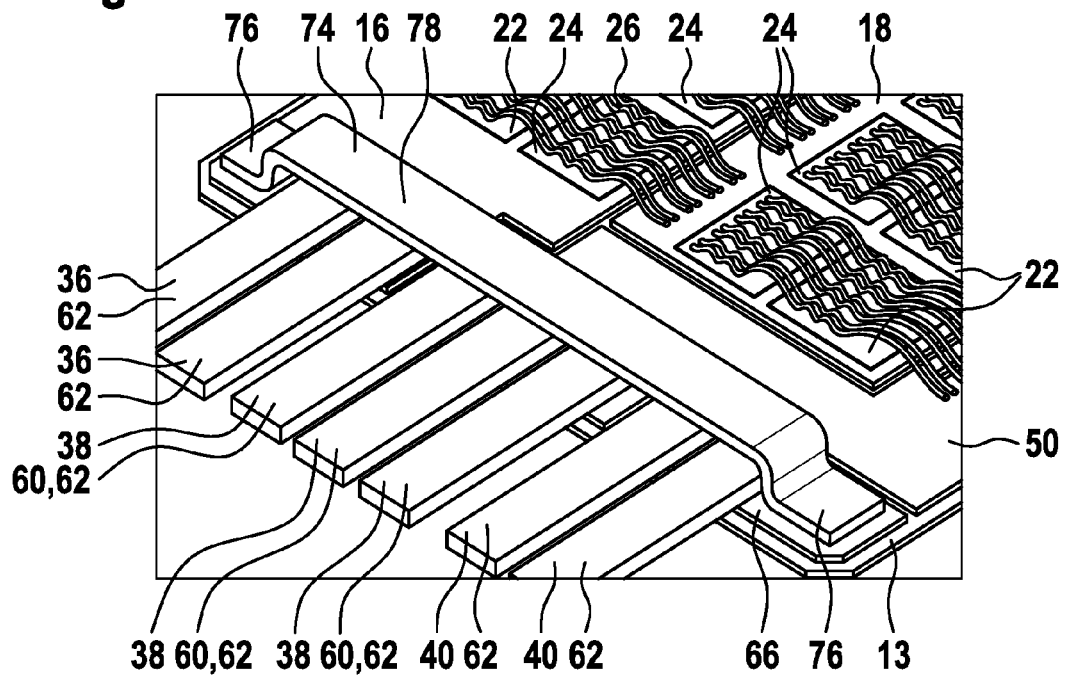
FIG. 4B schematically shows a perspective view of a part of the half-bridge module of FIG. 4A.

As shown in FIGS. 4A and 4B, the metal clip 74 is bonded with one end 76 to the bonding area of the first outer DC terminal 36 and/or the first conducting area 16. With the other end 76, it is bonded to the auxiliary conducting area 66. With its elevated middle section 78, the metal clip runs above all ends 62 of the DC terminals 36, 38, 40.

Figure 5A:
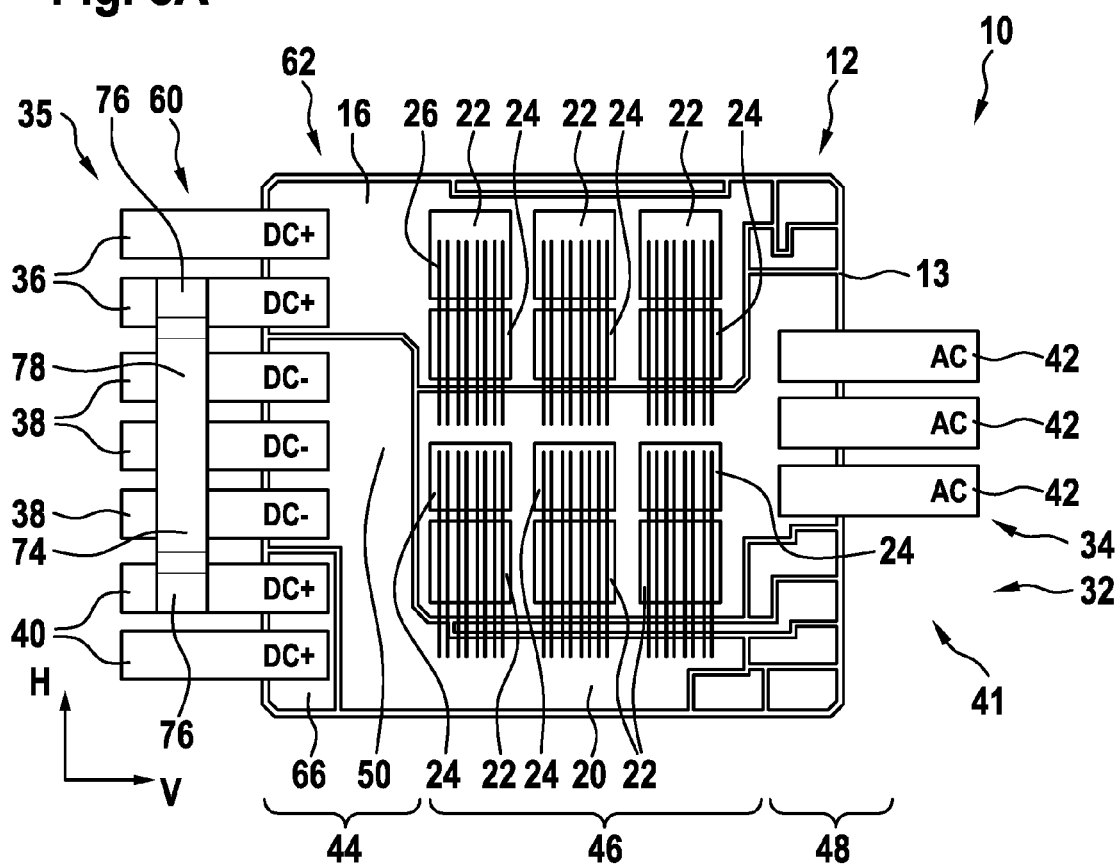
FIG. 5A schematically shows a top view of a half-bridge module according to a further embodiment.
Figure 5B:
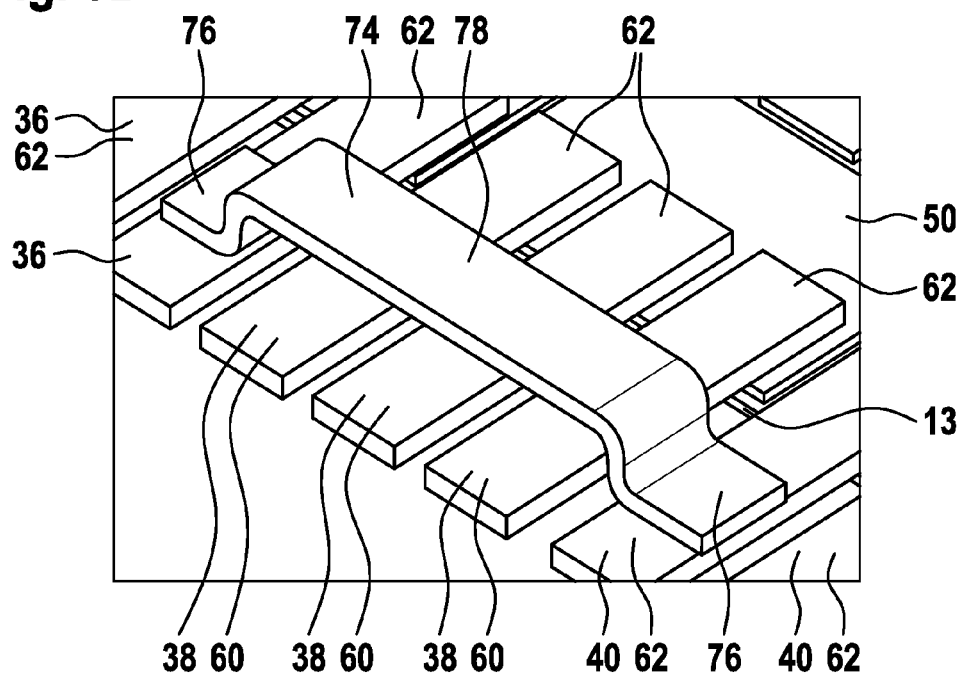
FIG. 5B schematically shows a perspective view of a part of the half-bridge module of FIG. 5A.
Figure 5C:
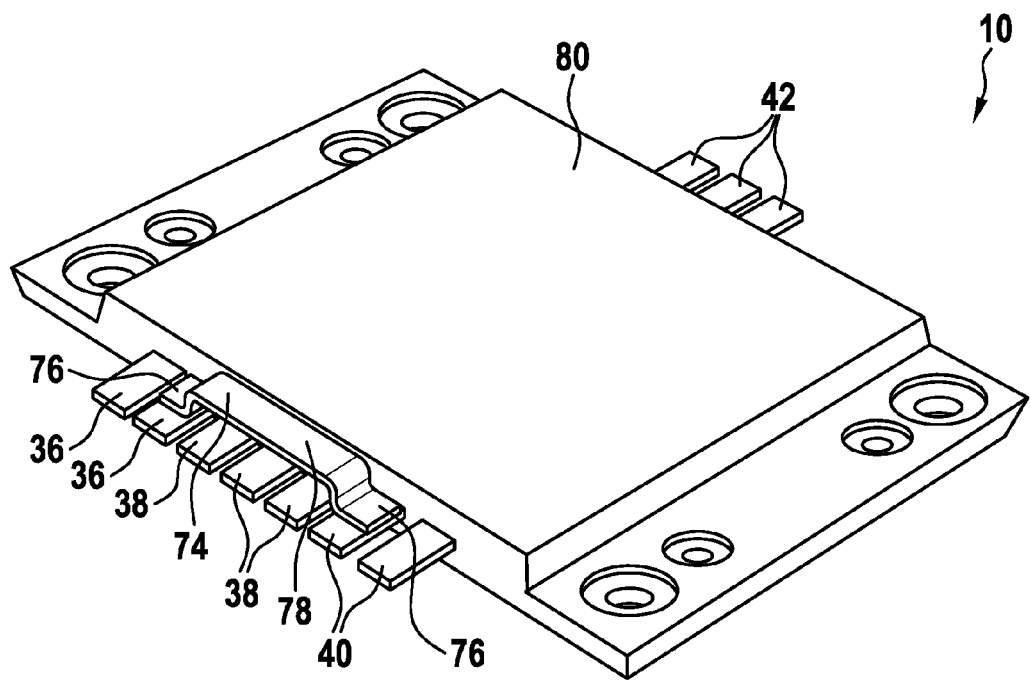
FIG. 5C schematically shows a perspective view of the half-bridge module of FIG. 5A with a mold encapsulation.

As shown in FIGS. 5A, 5B and 5C, the metal clip 74 also may be bonded with one end 76 to one of the first outer DC terminals 36 and with the other end 76 to one of the second outer DC terminals 40. In this case, the metal clip 74 may be bonded to the innermost outer DC terminals 36, 40. Furthermore as shown, the metal clip 74 may be bonded to the outer DC terminals 36, 40 outside of the substrate 12. However, it is also possible that the bonding takes place above the substrate 12.

As shown in FIG. 5C, all the components of the module 10 may be molded into a mold encapsulation 80. The metal strip 74 may be bonded to the outer DC terminals 36, 40 outside of the mold encapsulation 80. However, it also may be provided inside the mold encapsulation 80.

Such a mold encapsulation 80 also may be provided for the embodiments shown in FIG. 1A to 4C. For these embodiments, only the ends 60 of the terminal may protrude from the mold encapsulation 80, and or the bridging element 52, 70 may be encased into the mold encapsulation 80.

The above figures show embodiments with a coaxial terminal arrangement 35 that is interconnected with a substrate 12, which base metallization layer 14 is separated into areas 16, 18, 20 as described above. The interconnection of the areas 16, 18, 20 to the coaxial terminal arrangement 35 is achieved with a bridging element 52.

In the following, embodiments of power modules 10', which provide other possibilities of interconnecting the metallisation areas on a substrate 12 with a bus bar.

Figure 6:
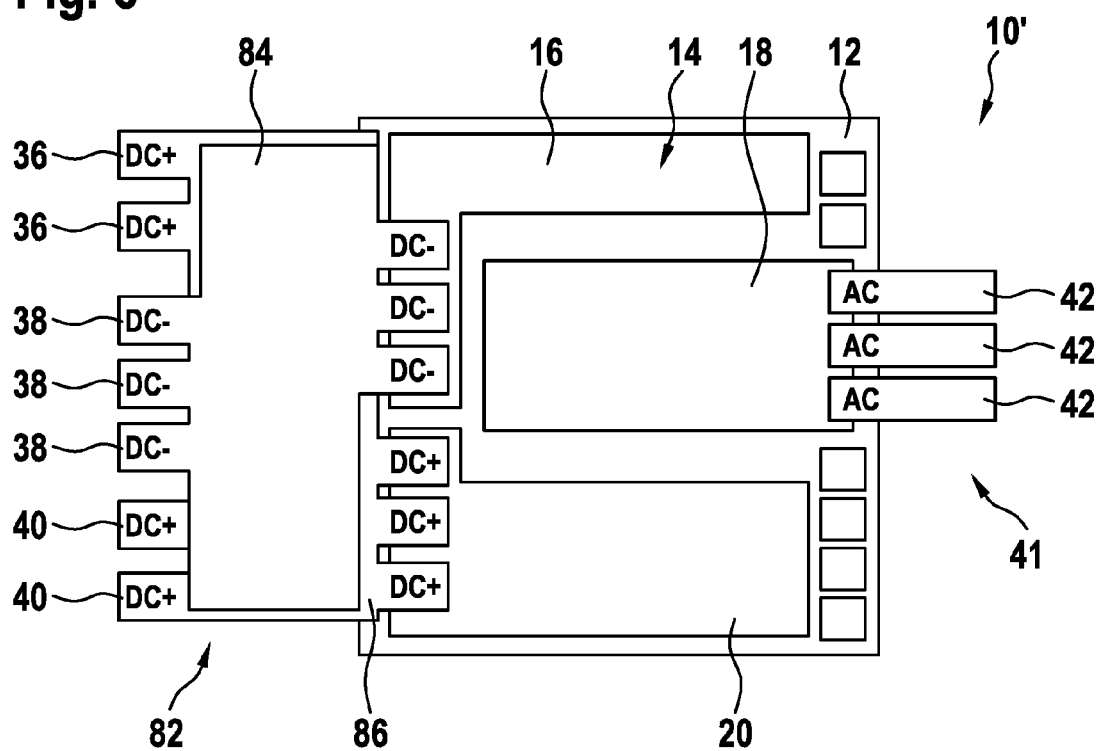
FIG. 6 schematically shows a top view of a half-bridge module.

FIG. 6 shows a power module 10' which comprises a substrate 12, like the power modules 10 in the previous figures. However, the DC terminal areas 16, 20 are connected with a coplanar terminal arrangement 82. The coplanar terminal arrangement 82 comprises two substantially planer terminal plates 84, 86, which on one side are bonded to the DC conducting areas 16, 18 and on the other side provide outer DC terminals 36, 40 and inner DC terminals 38, which are arranged in a coaxial way.

Figure 7:
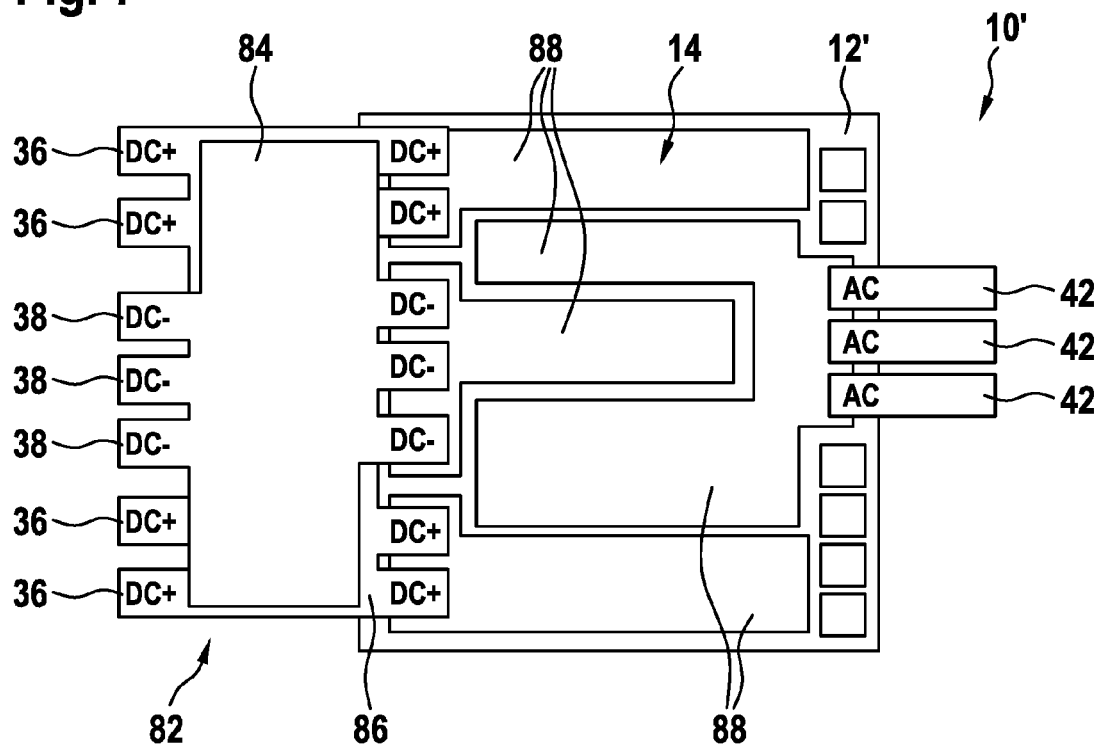
FIG. 7 schematically shows a top view of a half-bridge module.

FIG. 7 shows a power module 10', which comprises a substrate 12' that may be especially suited for SiC semiconductor switches. The substrate both prime is separated into conducting areas 88 that are coaxially arranged. The power module 10' of FIG. 7 also has coplanar terminal arrangement 82, which however has not only coaxial DC terminals 36, 38, 40, but is also connected to the conducting areas 88 in a coaxial way.

In general, the external bus bar design may also be changed to a coplanar bus bar, which may allow a very simple, low-cost, and natural connection to power modules with leadframe terminals and both standard and coaxial substrate designs. For example the coplanar terminal arrangement 82, of FIG. 6 and FIG. 8, may be a bus bar connection to a capacitor bank. In FIG. 6, the power module 10' may be equipped with Si switches. In FIG. 7, the power module 10' may be equipped with SiC switches.

Figure 8:
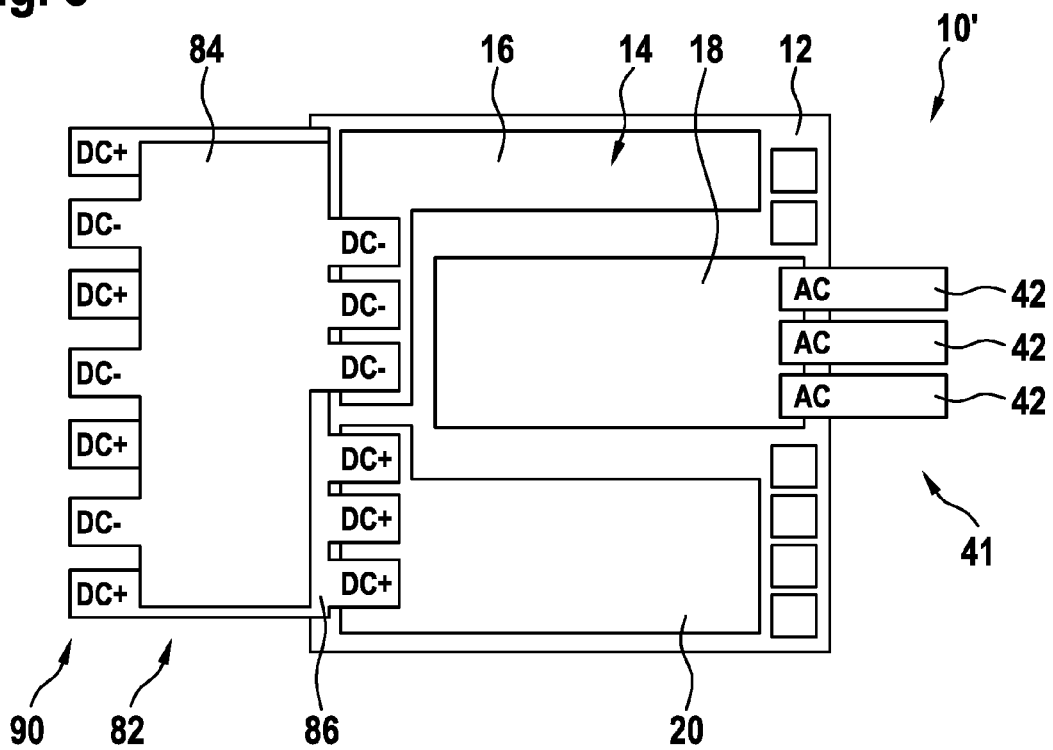
FIG. 8 schematically shows a top view of a half-bridge module.
Figure 9:
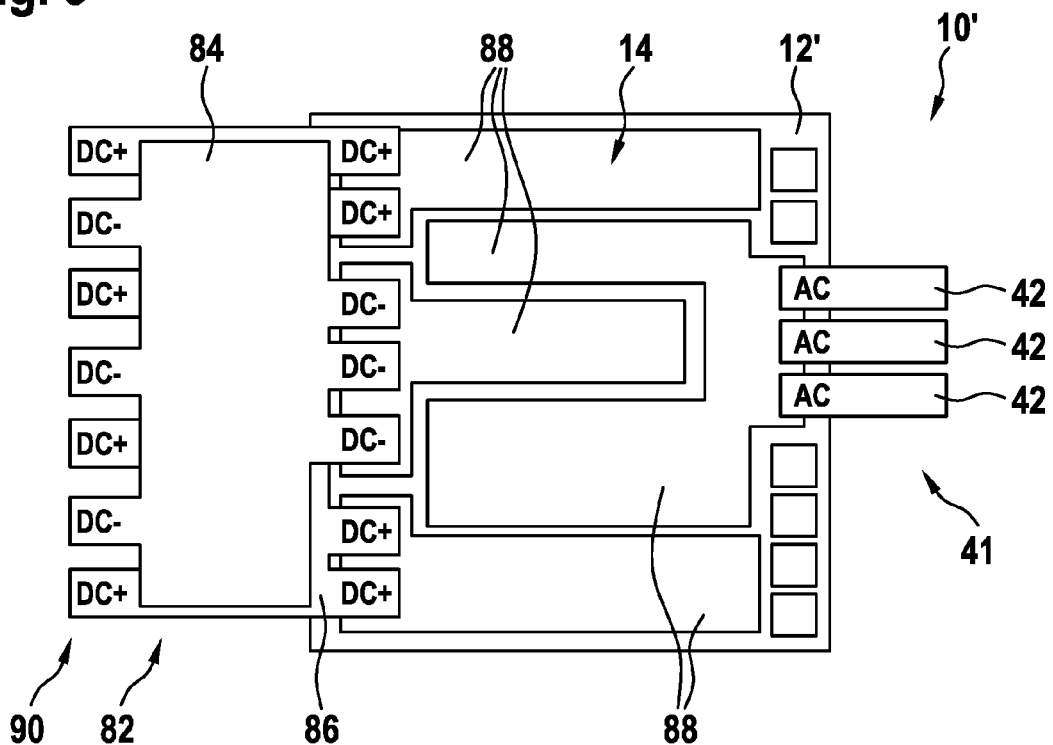
FIG. 9 schematically shows a top view of a half-bridge module.

FIG. 8 and FIG. 9 show power modules 10' with substrates 12 or 12' analogously to FIG. 6 and FIG. 7. The power modules 10' also have a coplanar terminal arrangement 82, which on the side of the substrate 12, 12' is designed like the one of FIG. 6 and FIG. 7. However, on the other side the terminal plates 84, 86 have interleaved DC terminals 90. A configuration with interleaved DC+ and DC− terminals 90, i.e. alternating DC+ and DC− connections, to an external capacitor bus bar may be attractive, as it may even further reduce the stray inductance.

Figure 10:
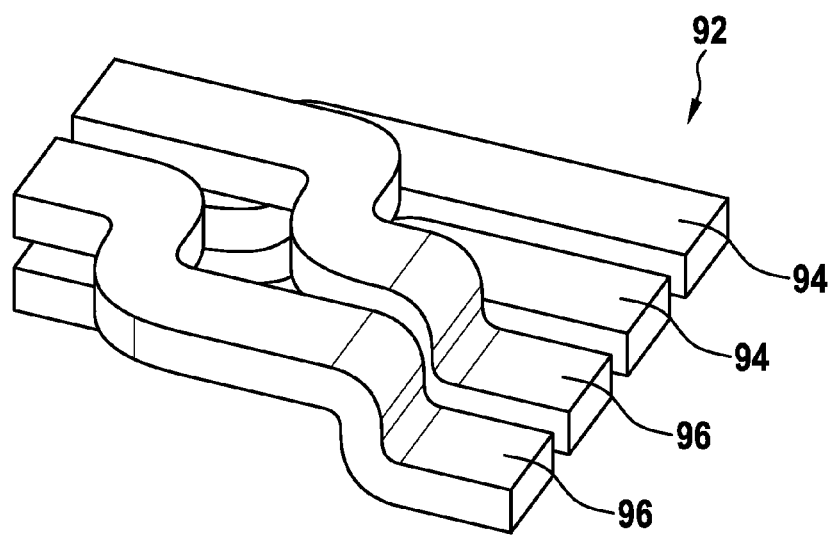
FIG. 10 schematically shows a perspective view of a bridging arrangement for interconnecting a half-bridge module with a bus bar.
Figure 11:
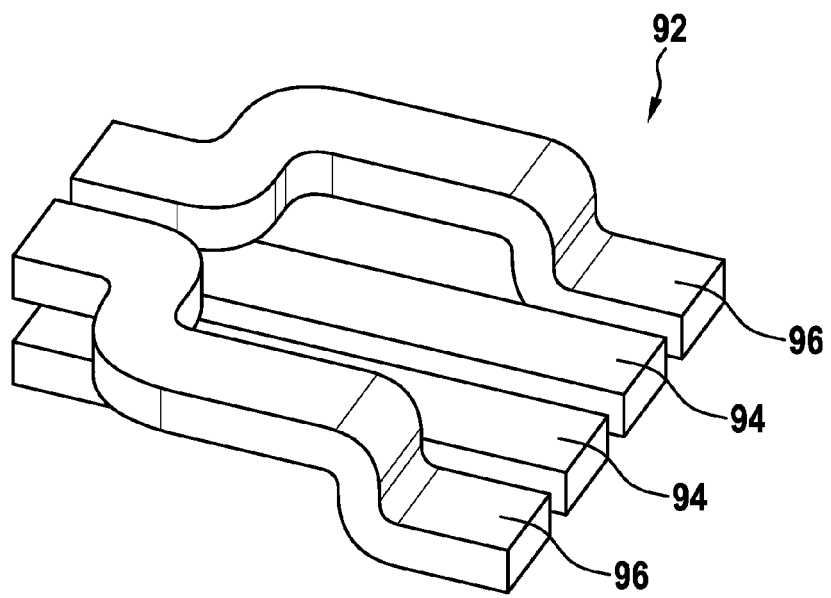
FIG. 11 schematically shows a perspective view of a bridging arrangement for interconnecting a half-bridge module with a bus bar.

FIG. 10 and FIG. 11 show terminal arrangements 92 that instead of the coplanar terminal arrangement 82 shown in FIG. 6 to FIG. 9 may connect a substrate 12, 12' with a bus bar. In FIG. 10, there are two pairs of DC terminals 94, 96 on different potential. For example, the DC terminals 94 may be DC+ terminals and the DC terminals 96 may be DC−terminals, or vice versa. The DC terminals 94 are arranged beside the DC terminals 96 on the side of the substrate 12. On the other side, the DC terminals 94 are guided below the DC terminals 96, such that the DC terminals 94, 96 are arranged directly one above the others.

In FIG. 11, the DC terminals 94 and 96 are arranged coaxially on the side of the substrate 12'. Analogously to FIG. 10, the DC terminals 94 are guided below the DC terminals 96.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS

10, 10' half-bridge module
12, 12' substrate
14 base metallization layer
16 first DC conducting area
18 AC conducting area
20 second DC conducting area
22 power semiconductor switch chip
24 power semiconductor diode chip
26 bond wire
28 row of high-side semiconductor switch chips
30 row of high-side semiconductor diode chips
32 row of low-side semiconductor switch chip
34 row of low-side semiconductor diode chip
35 coaxial DC terminal arrangement
36 first outer DC terminal
38 inner DC terminal
40 second outer DC terminal
41 AC terminal arrangement
42 AC terminal
44 DC bonding/current distribution section
46 chip bonding/middle section
48 AC bonding section
H protrusion direction of terminals
V direction
50 part of second DC conducting area
52 part of first DC conducting area, bridging element
54 insulating substrate
56 elevated metallization layer
58 wire bond
60 connection end
62 bonding end
64 middle section
66 auxiliary conducting area
68 insulating substrate
70 elevated metallization layer, bridging element
72 wire bond
74 metal clip
76 bonding end
78 middle section
80 mold encapsulation
10' power modules 82 coplanar terminal arrangement
84 planer terminal plate
86 planer terminal plate
88 conducting area
90 interleaved DC terminals
92 terminal arrangement
94 DC terminal
96 DC terminal

The invention claimed is:

1. A half-bridge module, comprising:
a substrate with a base metallization layer divided into a first DC conducting area, a second DC conducting area and an AC conducting area;
at least one first power semiconductor switch chip bonded to the first DC conducting area and electrically interconnected with the AC conducting area;
at least one second power semiconductor switch chip bonded to the AC conducting area and electrically interconnected with the second DC conducting area;
a coaxial terminal arrangement comprising at least one inner DC terminal, at least one first outer DC terminal and at least one second outer DC terminal;
wherein the at least one inner DC terminal, the at least first outer DC terminal and the at least one second outer DC terminal protrude from the module and are arranged in a row, such that the at least one inner DC terminal is coaxially arranged between the at least one first outer DC terminal and the at least one second outer DC terminal;
wherein the at least one inner DC terminal is electrically connected to the second DC conducting area;
wherein the at least one first outer DC terminal and the at least one second outer DC terminal are electrically connected to the first DC conducting area;
wherein the at least one first outer DC terminal and the at least one second outer DC terminal are electrically interconnected with an electrically conducting bridging element which is adapted for distributing at least a half of the load current between the at least one first outer DC terminal and the at least one second outer DC terminal,
wherein an insulating substrate with an elevated metallization layer is attached to the base metallization layer;
wherein the bridging element is provided by the elevated metallization layer or a bridging part of the first DC conducting area below the elevated metallization layer.

2. The half-bridge module of claim 1,
wherein the bridging element is arranged inside a housing of the module, in which the substrate and the semiconductor chips are accommodated;
wherein the housing is a mold encapsulation.

3. The half-bridge module of claim 1,
wherein the at least one first and/or second power semiconductor switch chip is a Si chip;
wherein a plurality of power semiconductor chips providing a freewheeling diode are bonded to the first DC conducting area and the AC conducting area.

4. The half-bridge module of claim 1,
wherein the at least one first outer DC terminal and the at least one second outer DC terminal are bonded to the bridging part.

5. The half-bridge module of claim 4,
wherein the at least one inner DC terminal is bonded to the elevated metallization layer.

6. The half-bridge module of claim 1,
wherein the at least one first outer DC terminal is bonded to the first DC conducting area;

wherein the at least one second outer DC terminal is bonded to an auxiliary conducting area of the base metallization layer separated from the first DC conducting area.

7. The half-bridge module of claim 6,
wherein the elevated metallization layer is attached above the second DC conducting area;
wherein the elevated metallization layer is electrically interconnected with the first DC conducting area and with the auxiliary conducting area.

8. The half-bridge module of claim 6, wherein the at least one inner DC terminal is bonded to a part of the second DC conducting area, which is guided below the bridging element.

9. The half-bridge module of claim 1,
wherein the module comprises at least two inner DC terminals;
wherein the module comprises at least two first outer DC terminals and at least two second outer DC terminals.

10. The half-bridge module of claim 1,
wherein the DC terminals are made of metal strips;
wherein the DC terminals have a same cross-section.

11. The half-bridge module of claim 1,
wherein the module comprises at least one AC terminal electrically interconnected with the AC conducting area;
wherein the at least one AC terminal is directly bonded to the AC conducting area;
wherein the at least one AC terminal is arranged on an opposite side of the module with respect to the coaxial terminal arrangement;
wherein the at least one AC terminal protrudes from the module opposite to a protrusion direction of the at least one first outer DC terminal, at least one inner DC terminal and at least one second outer DC terminal;
wherein the module comprises at least two AC terminals.

12. The half-bridge module of claim 2,
wherein the at least one first and/or second power semiconductor switch chip is a Si chip;
wherein a plurality of power semiconductor chips providing a freewheeling diode are bonded to the first DC conducting area and the AC conducting area.

13. The half-bridge module of claim 2, wherein the at least one first outer DC terminal and the at least one second outer DC terminal are bonded to the bridging part.

14. The half-bridge module of claim 13, wherein the at least one inner DC terminal is bonded to the elevated metallization layer.

15. The half-bridge module of claim 2, wherein the at least one first outer DC terminal is bonded to the first DC conducting area; and
wherein the at least one second outer DC terminal is bonded to an auxiliary conducting area of the base metallization layer separated from the first DC conducting area.

16. The half-bridge module of claim 3, wherein the at least one first outer DC terminal is bonded to the first DC conducting area; and
wherein the at least one second outer DC terminal is bonded to an auxiliary conducting area of the base metallization layer separated from the first DC conducting area.

17. The half-bridge module of claim 15, wherein the elevated metallization layer is attached above the second DC conducting area;

wherein the elevated metallization layer is electrically interconnected with the first DC conducting area and with the auxiliary conducting area.

18. The half-bridge module of claim 16, wherein the elevated metallization layer is attached above the second DC conducting area;
wherein the elevated metallization layer is electrically interconnected with the first DC conducting area and with the auxiliary conducting area.

19. The half-bridge module of claim 7, wherein the at least one inner DC terminal is bonded to a part of the second DC conducting area, which is guided below the bridging element.

20. The half-bridge module of claim 2, wherein the module comprises at least two inner DC terminals; and
wherein the module comprises at least two first outer DC terminals and at least two second outer DC terminals.

* * * * *